United States Patent [19]
Ootani

[11] Patent Number: 4,933,905
[45] Date of Patent: Jun. 12, 1990

[54] SEMICONDUCTOR MEMORY DEVICE FOR REDUCING POWER DISSIPATION DURING A WRITE OPERATION

[75] Inventor: Takayuki Ootani, Tokyo, Japan

[73] Assignee: Kabushiki Kaisha Toshiba, Kawasaki, Japan

[21] Appl. No.: 229,879

[22] Filed: Aug. 8, 1988

[30] Foreign Application Priority Data

Aug. 13, 1987 [JP] Japan .................................. 62-202389

[51] Int. Cl.$^5$ .......................... G11C 7/00; G11C 8/00
[52] U.S. Cl. .................................... 365/190; 365/203; 365/154; 365/189.06
[58] Field of Search .................... 365/190, 227, 189.06, 365/233, 203, 154; 307/530

[56] References Cited

U.S. PATENT DOCUMENTS

| | | | |
|---|---|---|---|
| 4,195,356 | 3/1980 | O'Connell et al. ................. | 365/189 |
| 4,202,045 | 5/1980 | Kung et al. .......................... | 365/203 |
| 4,730,279 | 3/1988 | Ohtani .............................. | 365/203 X |
| 4,760,561 | 7/1988 | Yamamoto et al. ............. | 365/190 X |
| 4,802,128 | 1/1989 | Watanabe et al. ................. | 365/190 |
| 4,802,129 | 1/1989 | Hoekstra et al. .................... | 365/190 |
| 4,813,022 | 3/1989 | Matsui et al. ....................... | 365/190 |

FOREIGN PATENT DOCUMENTS

| | | | |
|---|---|---|---|
| 0040917 | 12/1981 | European Pat. Off. ........... | 365/190 |
| 56-25288 | 3/1981 | Japan .................................. | 365/190 |
| 56-165982 | 12/1981 | Japan .................................. | 365/190 |
| 57-27489 | 2/1982 | Japan .................................. | 365/190 |

OTHER PUBLICATIONS

"A 25 ns 64 K SRAM" by Ozawa et al., IEEE Int'l Solid State Circuits Conference, San Francisco, Feb. 22-24, 1984, vol. 27, Conf. 31, pp. 218-219, 342.

"A 256 K CMOS RAM with Variable-Impedance Loads" by Yamamoto et al., 1985 IEEE Int'l Solid-State Circuits Conf., Digest of Technical Papers, pp. 58-59.

"A 10 $\mu$W Standby Power 256 K CMOS SRAM" by Kobayashi et al., 1985 IEEE Int'l Solid-State Circuits Conf., Digest of Technical Papers, pp. 60-61.

Primary Examiner—Stuart N. Hecker
Assistant Examiner—Alfonso Garcia
Attorney, Agent, or Firm—Finnegan, Henderson, Farabow, Garrett and Dunner

[57] ABSTRACT

A semiconductor memory device includes a control circuit for disabling a bit-line load circuit coupled to a column of memory cells in a static RAM only when a write enable signal and a column select signal are applied to the column.

4 Claims, 4 Drawing Sheets

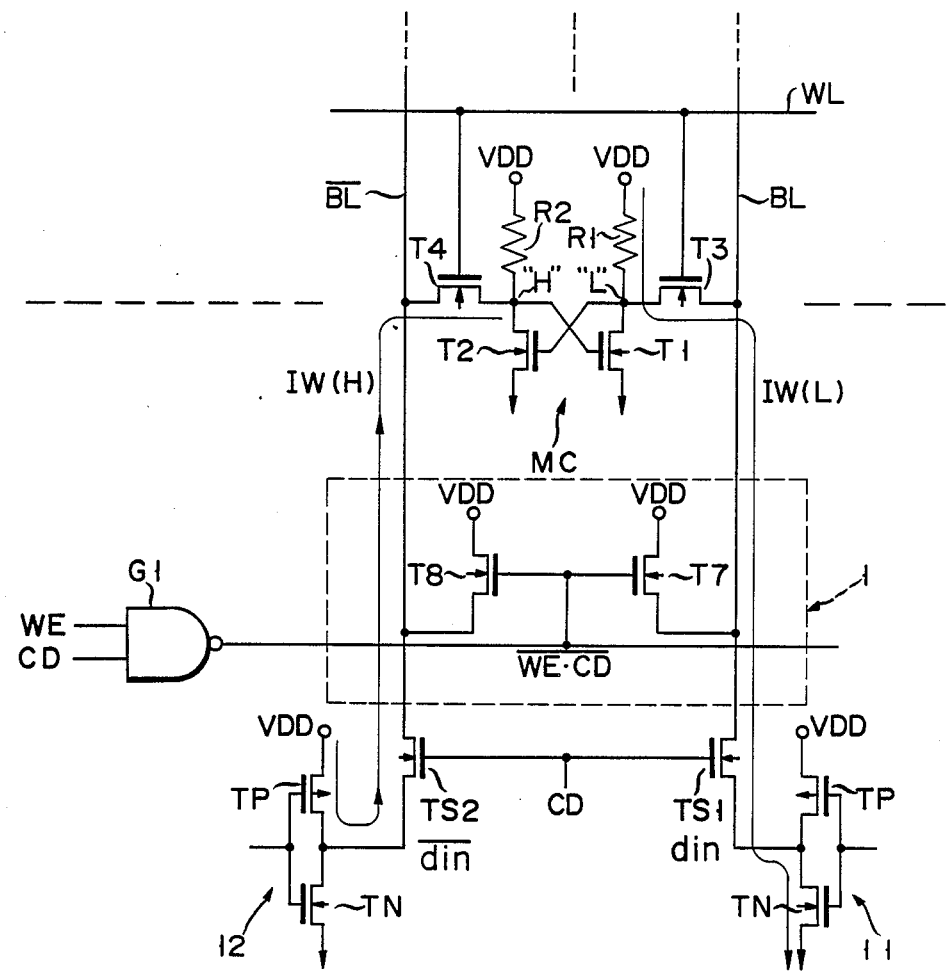
F I G. 2

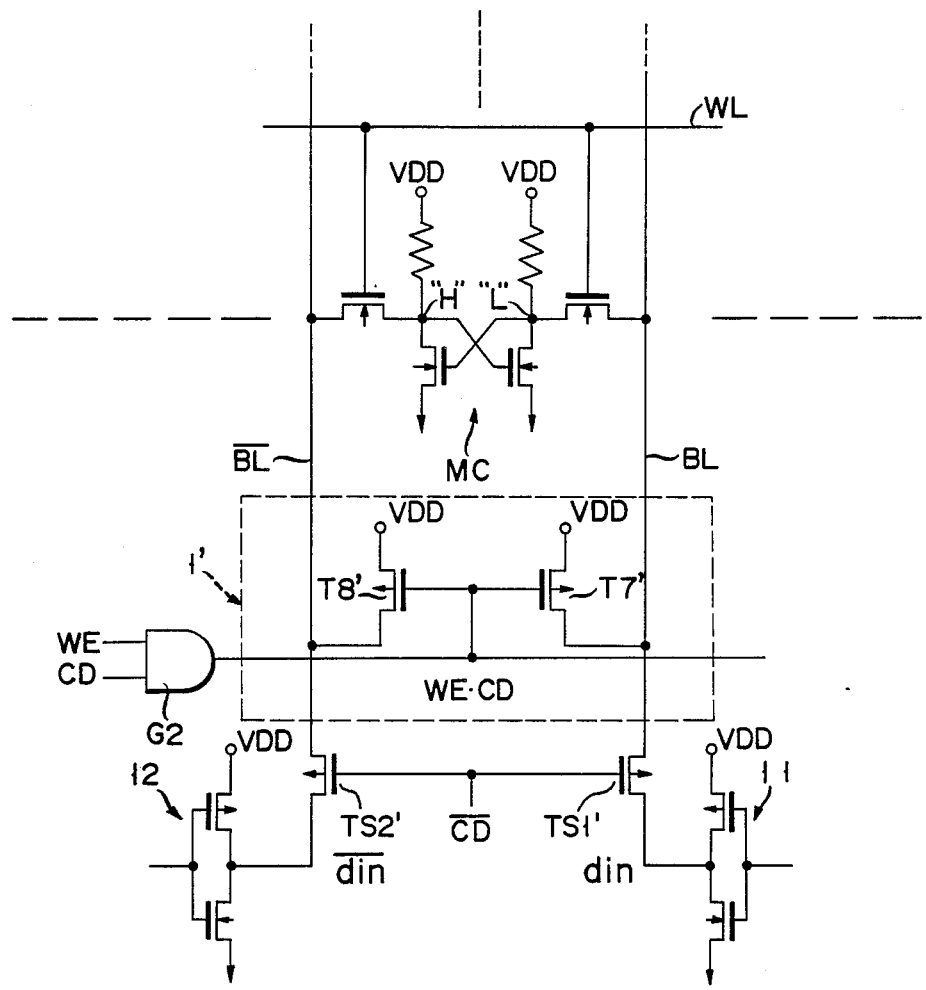
F I G. 3

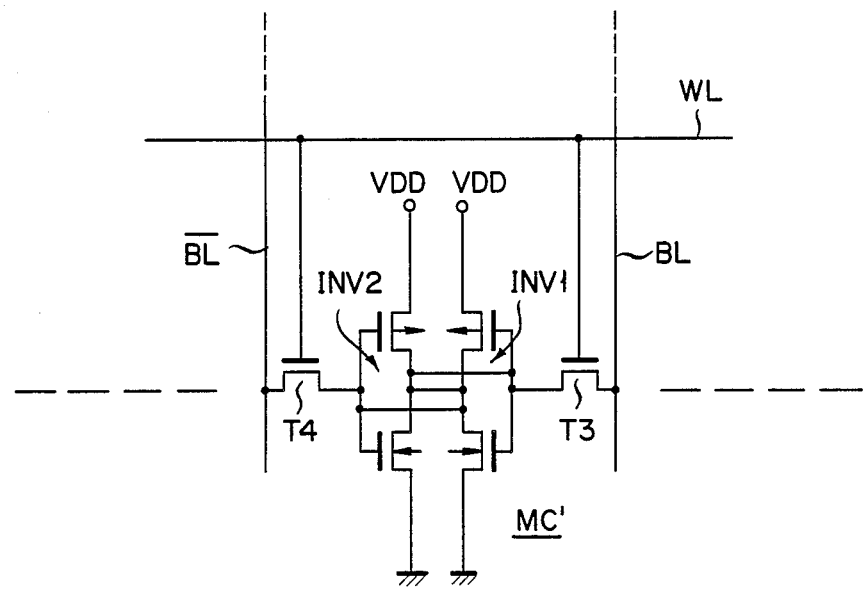
F I G. 4

SEMICONDUCTOR MEMORY DEVICE FOR REDUCING POWER DISSIPATION DURING A WRITE OPERATION

BACKGROUND OF THE INVENTION

1. Field of the Invention

The present invention relates to a semiconductor device provided with a driver circuit for a bit-line load circuit used particularly in a static random access memory (SRAM).

2. Description of the Related Art

FIG. 1 is a circuit diagram of a memory cell and associated circuit in a prior art SRAM. The arrangement of FIG. 1 comprises a memory cell MC, a word line WL for selecting memory cell MC, a pair of bit lines BL and $\overline{BL}$ provided normal to word line WL for transmitting and receiving data to and from memory cell MC, a bit-line load circuit 30 coupled to bit lines BL and $\overline{BL}$, N-channel MOS transistors TS1 and TS2 coupled to bit lines BL and $\overline{BL}$ adapted for selecting a column, and a pair of data write circuits 31 and 32 coupled to bit lines BL and $\overline{BL}$ via transistors TS1 and TS2.

Memory cell MC comprises a flip-flop circuit having a pair of N-channel MOS transistors T1 and T2 for data storage and a pair of high-resistance load elements R1 and R2, and a pair of transfer-gate N-channel MOS transistors T3 and T4 coupled between one of input/output nodes of the flip-flop circuit and bit line BL and between the other of input/output nodes of the flip-flop circuit and bit line $\overline{BL}$. Bit-line load circuit 30 comprises a pair of N-channel MOS transistors T5 and T6 the drain and gate of each of which are supplied with a supply voltage VDD. Thus T5 and T6 are normally on. Each of data write circuits 31 and 32 is a complementary MOS (CMOS) inverter having a P-channel transistor Tp and an N-channel transistor Tn which are connected in series and whose gates are connected together. Output nodes of the CMOS inverters are coupled to bit lines BL and $\overline{BL}$ through the MOS transistor TS1 and TS2, respectively.

In the SRAM, to write a logical level "0" into the memory cell, data write circuits 31 and 32 are driven so that outputs din and $\overline{din}$ thereof may go to a low and a high level, respectively. Further, column select transistors TS1 and TS2 are switched ON by a column decoder output CD, and word line WL is raised to a high level by a word select signal. As a result, bit lines BL and $\overline{BL}$ go to sufficiently low and high levels, respectively, and the drains of transistors T1 and T2 in memory cell MC go to low and high levels, respectively. In this case, as shown, a direct current Iw flows through a path extending from bit-line load circuit 30, through bit line BL and column select transistor TS1, to data write circuit 31 during a write operation period. The direct current Iw is about 1~1.5 mA per column. For example, in an SRAM of 8 bits per word in which 8 columns are selected at the same time, the currents flowing through selected columns will amount to 8~12 mA. At this time, a direct current IR will also flow through a nonselected column, IR flows from bit-line load circuit 30, bit line BL and transistors T3 and T1, which approximately equals the direct current IW flowing through a selected column during a read operation. Through all the nonselected columns in the SRAM, currents will flow which approximately equal the currents flowing through the selected columns during a write operation. These form a principal cause of the power dissipation during a write operation in SRAMs.

SUMMARY OF THE INVENTION

It is an object of the present invention to provide a semiconductor memory device which is capable of lowering power dissipation in selected columns during a write operation without hindrance to the write operation.

The present invention is made by noticing that, in order to perform the above-described operation for writing into a memory cell, the bit-line load circuit need not necessarily be enabled, and on the contrary the enabling the load circuit will increase the current dissipation.

The semiconductor memory device of the present invention is characterized by controlling in such a way that a bit-line load circuit connected to a column in a memory cell array in an SRAM is enabled only when the column is selected for writing and disabled at other times.

That is, in a column selected during a write operation, the bit-line load circuit is OFF and hence a direct current flowing from a selected memory cell, via the low-level bit line, to the low-level data write circuit is limited to a very small value by a high-resistance load element in the memory cell. At this time, a charging current flows from the high-level data write circuit via the high-level bit line into the selected memory cell, but no direct current flows. Accordingly, the current dissipation becomes very small so that power dissipation can be lowered during a write operation.

BRIEF DESCRIPTION OF THE DRAWINGS

FIG. 2 is a circuit diagram of a memory cell, a bit-line load circuit and data write circuits in a column in a semiconductor memory device according to an embodiment of the present invention;

FIG. 3 shows a modification of the embodiment of FIG. 2; and

FIG. 4 shows a further modification of the embodiment.

DETAILED DESCRIPTION OF THE PREFERRED EMBODIMENTS

Figure 1:
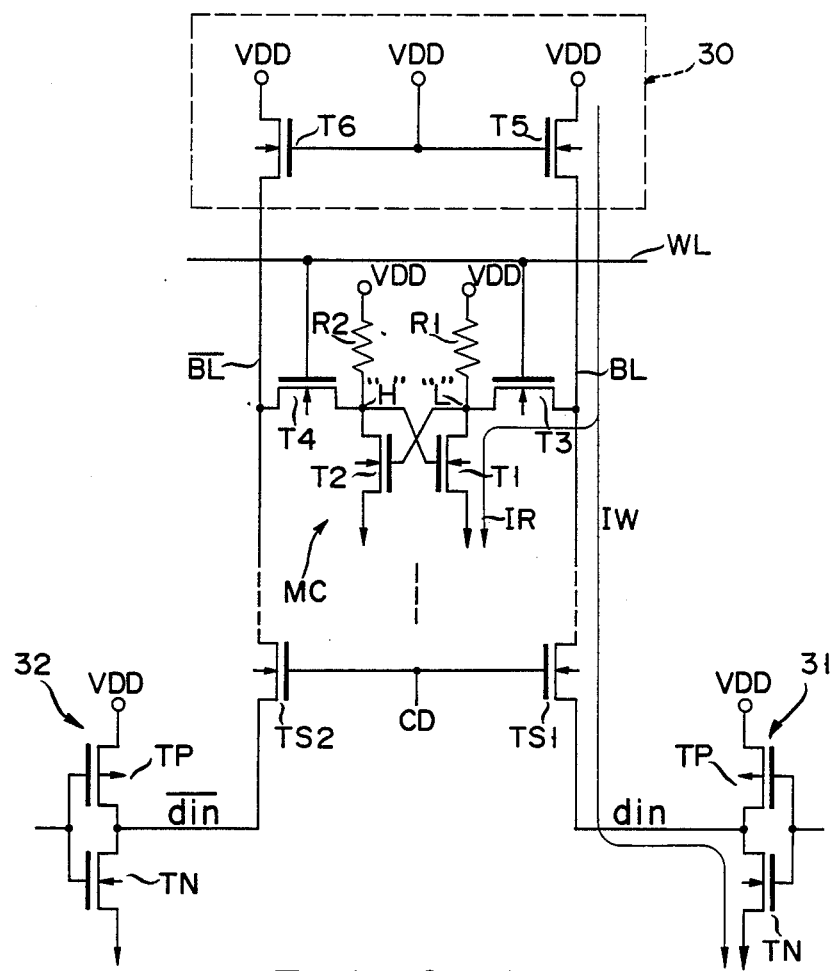
FIG. 1 is a circuit diagram of a memory cell in a conventional SRAM.

FIG. 2 shows part of a column in a memory cell array of an SRAM of 8 bits per word and data write circuits. That is, MC denotes a memory cell in the column, and BL and $\overline{BL}$ a pair of bit lines for the column to which a number of memory cells are coupled. WL denotes a word line adapted for memory cell selection, and numeral 1 a bit-line load circuit coupled to bit lines BL and $\overline{BL}$. Bit-line load circuit 1 is enabled or disabled by combination of a write enable signal WE for the SRAM and a column select signal CD as described later. TS1 and TS2 denote a pair of column-selecting N-channel MOS transistors (switches), and 11 and 12 are data write circuits coupled to bit lines BL and $\overline{BL}$ via transistors TS1 and TS2.

Memory cell MC comprises a flip-flop circuit having a pair of N-channel MOS transistors T1 and T2 for data storage and a pair of high-resistance load elements R1 and R2, and a pair of transfer-gate N-channel MOS transistors T3 and T4 coupled between one of input/output nodes of the flip-flop circuit and bit line BL and between the other of input/output nodes of the flip-flop circuit and bit line $\overline{BL}$. Bit-line load circuit 1 comprises a pair of N-channel MOS transistors T7 and T8 coupled between bit line BL and a VDD power supply node and between bit line $\overline{BL}$ and the VDD power supply node. The gates of transistors T7 and T8 are connected to receive an enable/disable control signal WExCE provided from a NAND gate G1. Each of data write circuits 11 and 12 is a CMOS inverter having a P-channel transistor TP and an N-channel transistor TN which are connected in series and whose gates are connected together. Output nodes of the CMOS inverters are coupled to bit lines BL and $\overline{BL}$ via column select N-channel transistors TS1 and TS2, respectively.

In the SRAM, to select and write a logical level "0" into memory cell MC, for example, the WE signal and the CD signal are set at a high level, so that the control signal WExCD obtained at the output of NAND gate G1 goes low. Thus, transistors T7 and T8 are turned OFF to disable bit-line load circuit 1. Namely, a bit-line load circuit coupled to a column of the memory cell array is controlled to be disabled only when the column is selected during a write operation (WE=high level) and enabled at other times. In order to write a "0" into the memory cell, data write circuits 11 and 12 are driven so that outputs din and $\overline{din}$ thereof may go to the low and high levels, column select transistors TS1 and TS2 are turned ON by the CD signal, and word line WL is raised to a high level by a word line select signal.

Consequently, bit lines BL and $\overline{BL}$ go to sufficiently low and high levels, respectively, and the drains of transistors T1 and T2 in memory cell MC go to low and high levels, respectively. In this case, on the side of the low level in the selected column, a current Iw(L) flows through a path extending from the VDD power supply node, via high-resistance load element R1, transfer gate T3, bit line BL, column select transistor TS1 and N-channel transistor TN, to ground. It is to be noted that high-resistance load elements R1 and R2 are required to have a very high resistance value because the SRAM must have low power dissipation at its stand-by time. For example, where stand-by current is 2 μA in a 1 M-bit SRAM, a current per memory cell will be 2 μA/1024² and hence the resistance value will be VDD (=5 V)×1024²/2 μA=2.6×10¹² ohms. Therefore, the current Iw(L) is 1∼2 pico-A and is very small as compared to 1–1.5 mA in the conventional art so that a significant reduction in current dissipation can be effected.

On the high level side of the selected column, a current Iw(H) to charge the high level node of memory cell MC flows through a path extending from a VDD power supply node of data write circuit 12, via P-channel transistor TP, column select transistor TS2, bit line $\overline{BL}$ and transfer gate T4, to the high level node.

In this case, in memory cell MC, data-storage (current driver) transistor T2 has its gate biased low enough to be OFF so that no direct current flows into a ground terminal and only an small current flows into high value resistance R2.

According to the SRAM described above, in a write operation for a selected column in a write mode, direct current in the selected column is virtually zero. In this case, the operation of writing into the memory cell, which is the original object of the memory, is not affected. This is because one of the bit lines, which is to be raised to a high level, is driven by an inverter in a corresponding data write circuit. The other bit line which is to be lowered can be driven to become lower because the bit-line load circuit is disabled. This assures a reliable write operation, improving a write margin.

Further, a write recovery operation after the end of the write operation, that is, a recovery operation for recovering voltage levels of the bit lines at a switching time from a write operation to a read operation is not affected at all. This is because the bit lines are driven by inverters in the data write circuits (both the outputs din and $\overline{din}$ are driven to a high level), and the bit-line load circuit is enabled.

In the above-described embodiment, N-channel transistors are used for bit-line load circuit 1 and column select transistors TS1 and TS2. Alternatively, P-channel transistors T7', T8', TS1' and TS2' may be used as shown in FIG. 3. In this case, a signal WExCD provided from AND gate G2 is used as a control signal for transistors T7' and T8', and a signal $\overline{CD}$ is used for transistors TS1' and TS2'. In the SRAM using P-channel transistors T7' and T8' for bit-line load circuit 1', the bit lines BL, $\overline{BL}$ are raised to the VDD level, but the basic operation is the same as that in the above embodiment of FIG. 2. When the signals WE and CD are both high, transistors T7' and T8' are turned OFF by an output of AND gate G2 so that bit-line load circuit 1' is disabled.

Though a memory cell MC having high resistive elements R1 and R2 is used as a static RAM type cell in the embodiment of FIGS. 2 and 3, it is also possible to use a memory cell MC' of a CMOS type as shown in FIG. 4, in which elements corresponding to those shown in FIGS. 2 and 3 are denoted by the same reference numerals. In FIG. 4, memory cell MC' is composed of two CMOS inverters INV.1 and INV.2 which are connected between transfer gates T3 and T4.

According to a semiconductor device of the present invention, as described above, a significant reduction in the power dissipation in selected columns during a write operation can be achieved without hindrance to the read operation. Therefore, the semiconductor memory device of the present invention is well suited for application to a large-capacity semiconductor memory.

What is claimed is:

1. A semiconductor memory device for reducing power dissipation during a write operation, comprising:
a memory cell array including a plurality of static RAM type memory cells arranged in rows and columns;
a first bit line and a second bit line for each column of said memory cell array, the memory cells of each column being coupled between said first and second bit lines;
first and second data write circuits coupled to said first and second bit lines, respectively;
first and second column select switches for each column of said memory array, each said first column select switch being coupled in series with said first bit line between said first data write circuit and said memory cells, and each said second column select switch being coupled in series with said second bit line between said second data write circuit and said memory cells;
bit-line load circuits respectively associated with the columns of said memory cell array, each said bit-line load circuit being coupled to said first and second bit lines between each of said first and second column select switches and said memory cells; and means for applying a control signal to said bit-line load circuit to disable said bit-line load circuit when the column associated with said bit-line load circuit includes one of said memory cells that is in a write mode and the column is selected and for enabling said bit-line load circuit at other times.

2. A semiconductor memory device according to claim 1, wherein each said memory cell comprises first and second high-resistance load elements each having an end connected to a power supply terminal; first and second transfer gates, said first transfer gate being connected between the other end of said first high-resistance load element and said first bit line, and said second transfer gate being connected between the other end of said second high-resistance load element and said second bit line; and a flip-flop connected between said first and second transfer gates.

3. A semiconductor memory device according to claim 1, wherein each said bit-line load circuit comprises first and second FETs, said first FET being connected between said first bit line and a power supply terminal, and said second FET being connected between said second bit line and a power supply terminal; and means for applying said control signal to gates of said first and second FETs.

4. A semiconductor memory device according to claim 1, wherein said means for applying the control signal to said bit-line load circuit includes a gate circuit, connected to receive a write enable signal generated in the write mode of said memory cell and a column select signal provided when the column is selected, for providing a NAND output.

* * * * *